(12) United States Patent
Gunther et al.

(10) Patent No.: US 11,581,167 B2
(45) Date of Patent: *Feb. 14, 2023

(54) PROCESS KIT HAVING TALL DEPOSITION RING AND SMALLER DIAMETER ELECTROSTATIC CHUCK (ESC) FOR PVD CHAMBER

(71) Applicant: Applied Materials, Inc., Santa Clara, CA (US)

(72) Inventors: David Gunther, Santa Clara, CA (US); Siew Kit Hoi, Singapore (SG); Kirankumar Neelasandra Savandaiah, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/351,535

(22) Filed: Jun. 18, 2021

(65) Prior Publication Data

US 2022/0406573 A1 Dec. 22, 2022

(51) Int. Cl.
    *H01J 37/32* (2006.01)
    *C23C 14/50* (2006.01)
    *C23C 14/35* (2006.01)

(52) U.S. Cl.
    CPC ........ *H01J 37/32623* (2013.01); *C23C 14/35* (2013.01); *C23C 14/50* (2013.01); *H01J 37/32733* (2013.01); *H01J 2237/2007* (2013.01); *H01J 2237/332* (2013.01)

(58) Field of Classification Search
None
See application file for complete search history.

(56) References Cited

U.S. PATENT DOCUMENTS

| | | | |
|---|---|---|---|
| 6,171,453 B1 | 1/2001 | Chung et al. | |
| D888,903 S * | 6/2020 | Gunther | D23/269 |
| 2008/0141942 A1 | 6/2008 | Brown et al. | |
| 2011/0186426 A1 | 8/2011 | Hawrylchak et al. | |
| 2012/0103257 A1* | 5/2012 | Rasheed | C23C 14/3407 118/500 |
| 2013/0256962 A1 | 10/2013 | Ranish et al. | |

(Continued)

OTHER PUBLICATIONS

PCT International Search Report and Written Opinion for PCT/US2022/030502 dated Aug. 25, 2022.

*Primary Examiner* — Jason Berman
(74) *Attorney, Agent, or Firm* — Moser Taboada

(57) ABSTRACT

Embodiments of process kits are provided herein. In some embodiments, a process kit, includes: a deposition ring configured to be disposed on a substrate support, the deposition ring comprising: an annular band having an upper surface and a lower surface, the lower surface including a step between a radially inner portion and a radially outer portion, the step extending downward from the radially inner portion to the radially outer portion; an inner lip extending upwards from the upper surface of the annular band and adjacent an inner surface of the annular band, and wherein an outer surface of the inner lip extends radially outward and downward from an upper surface of the inner lip to the upper surface of the annular band; a channel disposed radially outward of the annular band; and an outer lip extending upwardly and disposed radially outward of the channel.

20 Claims, 6 Drawing Sheets

(56) References Cited

U.S. PATENT DOCUMENTS

2017/0002461 A1   1/2017   Johanson et al.
2017/0076924 A1*  3/2017   Johanson ................ C23C 14/34
2020/0194243 A1   6/2020   Gunther et al.

* cited by examiner

PROCESS KIT HAVING TALL DEPOSITION RING AND SMALLER DIAMETER ELECTROSTATIC CHUCK (ESC) FOR PVD CHAMBER

FIELD

Embodiments of the present disclosure generally relate to substrate processing equipment.

BACKGROUND

Process kits may be used in a physical vapor deposition (PVD) chamber to separate a processing volume from a non-processing volume. Over time, the process kits accumulate deposited material from the deposition processes performed in the PVD chamber. The process kits may include process shields, deposition rings, cover rings, or the like. For high deposition processes, deposition accumulation on the deposition ring builds up significantly to the point where the deposition can build up to the back of the substrate. At that point, the deposition can adhere or stick to the back of the substrate, which can cause substrate handling issues and lead to broken substrates. Although the deposition ring can be removed and replaced with a clean deposition ring, rapid accumulation of material deposited on the deposition ring leads to more frequent downtime to replace the deposition ring. The inventors have also observed that deposition rings may be prone to cracking or breaking over time.

Accordingly, the inventors have provided embodiments of improved deposition rings as disclosed herein.

SUMMARY

Embodiments of process kits are provided herein. In some embodiments, a process kit, includes: a deposition ring configured to be disposed on a substrate support, the deposition ring comprising: an annular band configured to rest on a lower ledge of the substrate support, the annular band having an upper surface and a lower surface, the lower surface including a step between a radially inner portion and a radially outer portion, the step extending downward from the radially inner portion to the radially outer portion; an inner lip extending upwards from the upper surface of the annular band and adjacent an inner surface of the annular band, wherein an inner surface of the inner lip and the inner surface of the annular band together form a central opening of the deposition ring, and wherein an outer surface of the inner lip extends radially outward and downward from an upper surface of the inner lip to the upper surface of the annular band; a channel disposed radially outward of the annular band; and an outer lip extending upwardly and disposed radially outward of the channel, wherein an upper surface of the outer lip and the channel are disposed beneath the lower surface of the annular band.

In some embodiments, a process kit, includes: a deposition ring configured to be disposed on a substrate support, the deposition ring comprising: an annular band configured to rest on a lower ledge of a substrate, the annular band having an upper surface and a lower surface, the lower surface including a step between a radially inner portion and a radially outer portion, the step extending downward from the radially inner portion to the radially outer portion; an inner lip extending upwards from the upper surface of the annular band and adjacent an inner surface of the annular band, wherein an inner surface of the inner lip and the inner surface of the annular band together form a central opening of the deposition ring, wherein an outer surface of the inner lip extends at an angle of about 5 degrees to about 15 degrees from a central axis of the deposition ring; a first leg extending downwardly from adjacent an outer surface of the annular band; a second leg extending radially outward from a bottom portion of the first leg; and an outer lip extending upwardly from the second leg, wherein the first leg, the second leg, and the outer lip together define a channel.

In some embodiments, a substrate support, includes: a pedestal having a substrate support surface having a given diameter for receiving a substrate and having an electrostatic chuck disposed therein, wherein the pedestal includes a lower ledge extending radially outward; and a process kit comprising: a deposition ring disposed on the lower ledge, the deposition ring comprising: an annular band that rests on the lower ledge, the annular band having an upper surface and a lower surface, the lower surface including a step between a radially inner portion and a radially outer portion, the step extending downward from the radially inner portion to the radially outer portion; an inner lip extending upwards from the upper surface of the annular band and adjacent an inner surface of the annular band, wherein an outer surface of the inner lip extends radially outward and downward from an upper surface of the inner lip to the upper surface of the annular band; a channel disposed radially outward of and beneath the annular band; and an outer lip extending upwardly and disposed radially outward of the channel.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
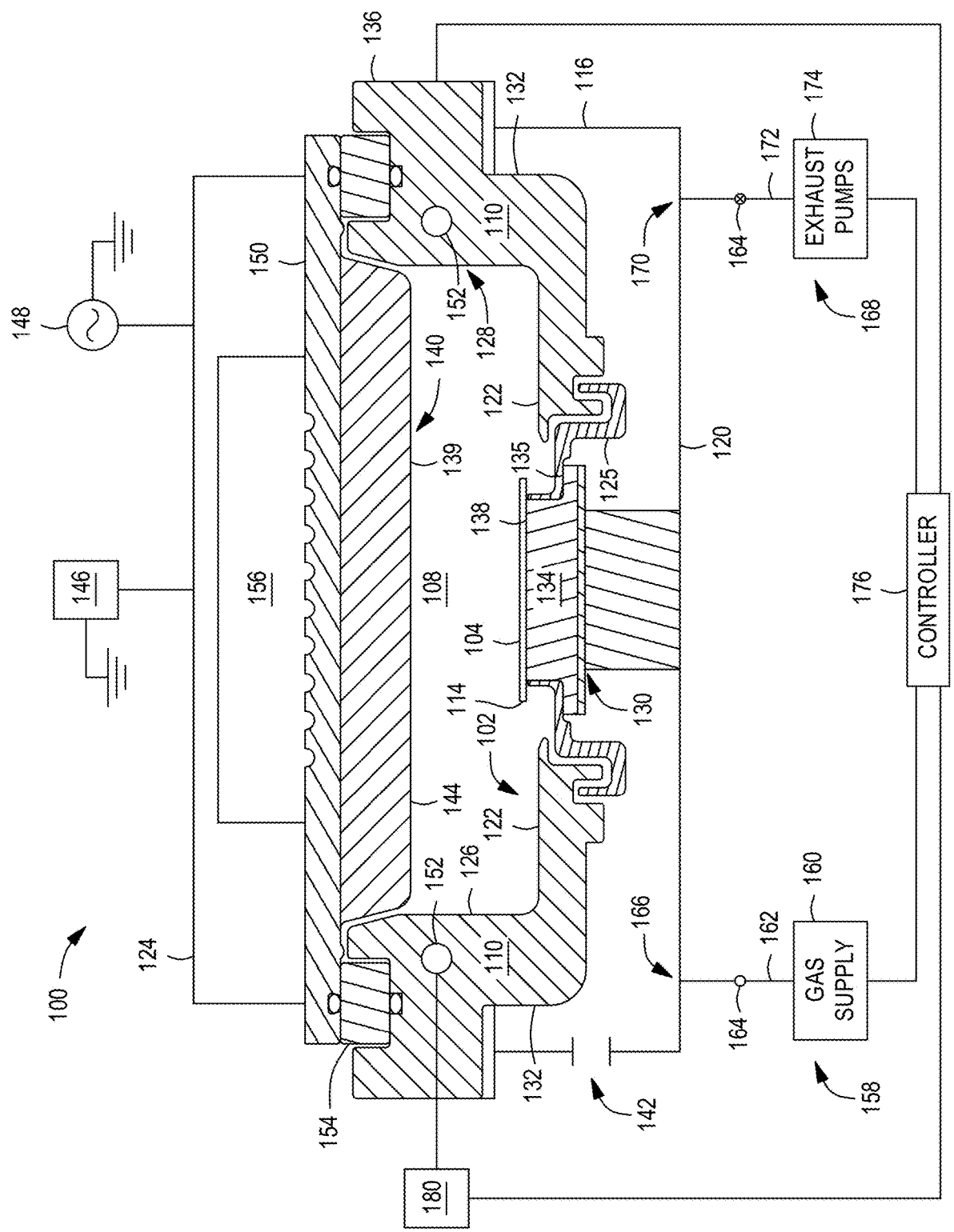
FIG. 1 depicts a schematic cross-sectional view of a process chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of process kits and process chambers incorporating such process kits are provided herein. In some embodiments, the process kit includes a one-piece process kit shield and a tall deposition ring, as provided herein. The deposition ring advantageously allows increased accumulation of deposited material on the deposition ring. As a result, the deposition ring may undergo more process cycles prior to cleaning since deposition does not adhere to the backside of the substrate being process as quickly when compared to conventional deposition rings. The deposition ring may also have suitable wall thickness and profiles to advantageously reduce or prevent cracking or breaking due to thermal cycling and/or accumulation of deposited material.

To further alleviate the problems associated with deposition adhering to the backside of the substrate, a clamp assembly may be provided to hold the deposition ring down if deposition on the deposition ring should adhere to the backside of the substrate. As a result, damage associated with the deposition ring being lifted with a substrate being lifted due to deposition adherence to the backside of the substrate is advantageously avoided because the clamp assembly prevents the deposition ring from being lifted.

FIG. 1 depicts a schematic, cross-sectional view of a process chamber 100 (e.g., a PVD chamber) having a process kit shield in accordance with some embodiments of the present disclosure. Other processing chambers may also benefit from the inventive apparatus disclosed herein.

The process chamber 100 comprises chamber walls 106 that enclose an inner volume 108. The chamber walls 106 include sidewalls 116, a bottom wall 120, and a ceiling 124. The process chamber 100 can be a standalone chamber or a part of a multi-chamber platform (not shown) having a cluster of interconnected chambers connected by a substrate transfer mechanism that transfers substrates 104 between the various chambers. The process chamber 100 may be a PVD chamber capable of sputter depositing material onto a substrate 104. Non-limiting examples of suitable materials for sputter deposition include one or more of aluminum, copper, tantalum, tantalum nitride, titanium, titanium nitride, tungsten, tungsten nitride, and the like.

The process chamber 100 generally includes a substrate support 130 which comprises a pedestal 134 to support the substrate 104. The pedestal 134 has a substrate support surface 138 having a plane substantially parallel to a sputtering surface 139 of a sputtering target 140 disposed in an upper section of the process chamber 100. The substrate support surface 138 of the pedestal 134 is designed to support a substrate 104 having a given width during processing. The width of the substrate 104 may be a diameter if the substrate 104 is round or a width if the substrate is square/rectangular. The substrate support surface 138 may have a given diameter, for example, about 285 mm to about 293 mm. The given diameter of the substrate support surface 138 may be less than the given width of the substrate 104 such that the substrate includes an overhanging edge 114. The pedestal 134 may include at least one of an electrostatic chuck or a heater (such as an electrical resistance heater, heat exchanger, or other suitable heating device).

In operation, a substrate 104 is introduced into the process chamber 100 through a substrate-loading inlet 142 in the sidewall 116 of the process chamber 100 and placed onto the substrate support 130. The substrate support 130 can be lifted or lowered by a support lift mechanism and a lift finger assembly can be used to lift and lower the substrate 104 onto the substrate support 130 during placement of the substrate 104 on the substrate support 130 by a robot arm. The pedestal 134 can be maintained at an electrically floating potential or grounded during plasma operation.

Figure 2:
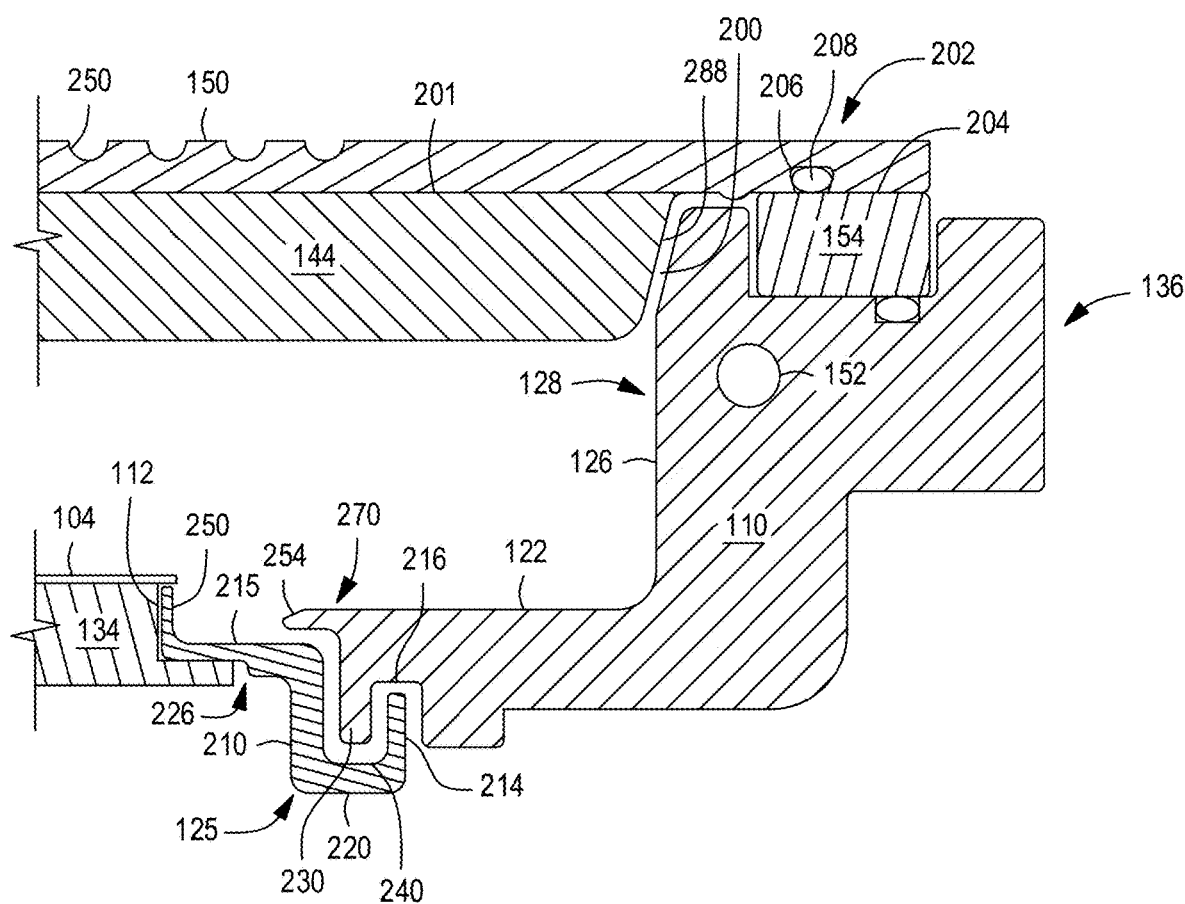
FIG. 2 depicts a cross-sectional view of a process kit in accordance with some embodiments of the present disclosure.

The process chamber 100 also contains a process kit 102, as shown in FIG. 2, which comprises various components that can be easily removed from the process chamber 100, for example, to dean sputtering deposits off the component surfaces, replace, or repair eroded components, or to adapt the process chamber 100 for other processes. The process kit 102 may include a one-piece shield 110. In some embodiments, the one-piece shield 110 includes a cylindrical body 126 having a diameter sized to encircle the sputtering surface 139 of the sputtering target 140 and the substrate support 130 (e.g., a diameter larger than the sputtering surface 139 and larger than the support surface of the substrate support 130). The cylindrical body 126 has an upper portion 128 that surrounds the outer edge of the sputtering surface 139 of the sputtering target 140 and a lower portion 132 that surrounds the substrate support 130.

The upper portion 128 includes an adapter section 136 for supporting the one-piece shield 110 on the sidewall 116 and a cover ring section 122 for placement about a peripheral wall 112 of the substrate support 130. The process kit 102 further includes a deposition ring, for example, deposition ring 125, disposed below the cover ring section 122. The deposition ring 125 sits on a lower ledge 135 of the substrate support 130. A bottom surface of the cover ring section 122 interfaces with the deposition ring 125. In some embodiments, a distance between the substrate support surface 138 and an upper surface of the lower ledge 135 is about 8 to about 11 mm. In some embodiments, the lower ledge 135 has a thickness of about 10 mm to about 15 mm.

Figure 3:
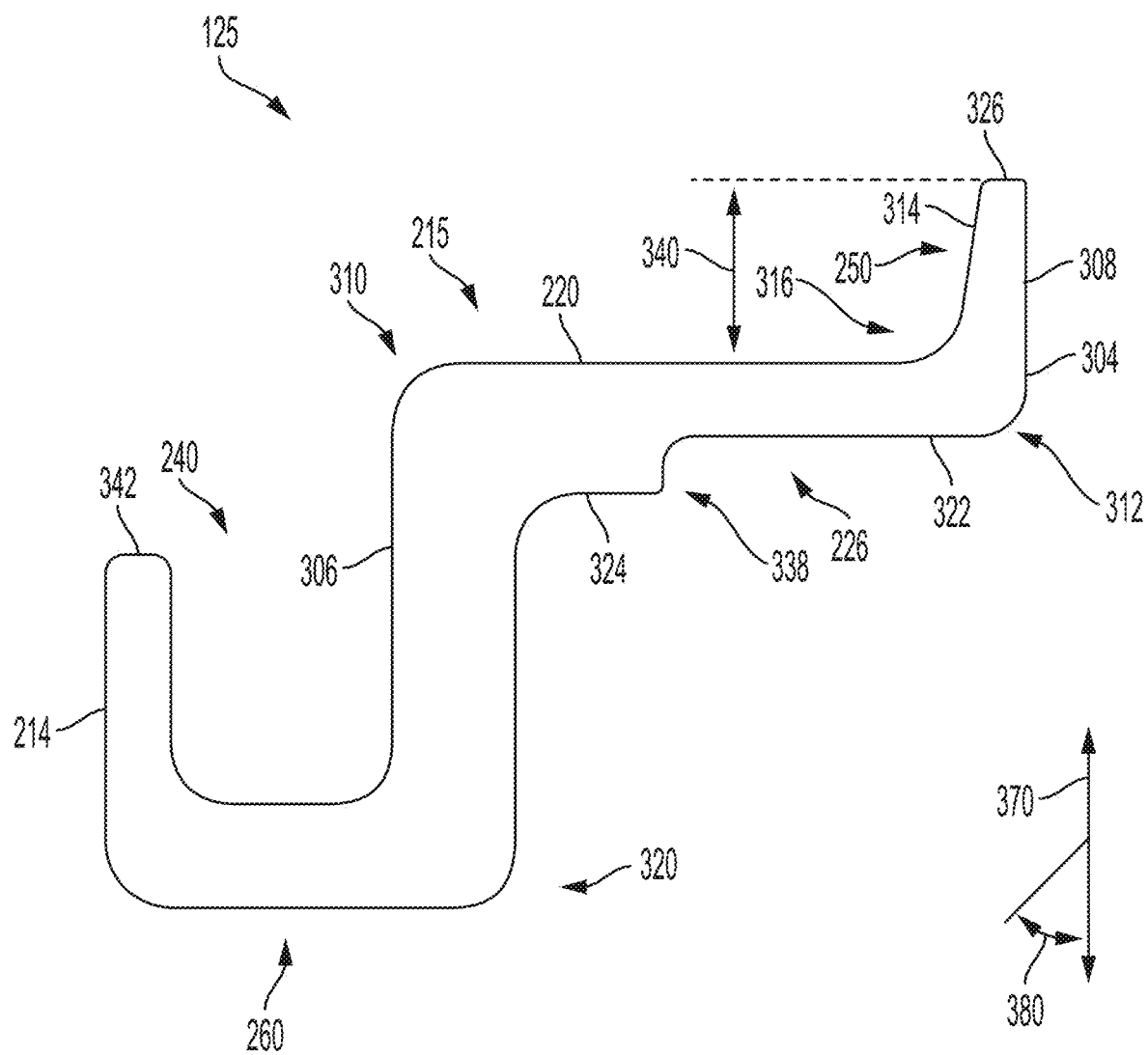
FIG. 3 depicts a cross-sectional view of a portion of a deposition ring in accordance with some embodiments of the present disclosure.

The deposition ring 125 comprises an annular band 215 that extends about and surrounds the peripheral wall 112 of the substrate support 130 as shown in FIGS. 2 and 3. FIG. 3 depicts a cross-sectional view of a portion of the deposition ring 125 in accordance with some embodiments of the present disclosure. The annular band 215 includes an upper surface 220 and a lower surface 226. The annular band 215 includes an inner surface 304 and an outer surface 306. In some embodiments, a distance from the inner surface 304 to the outer surface 306 is about 20.0 mm to about 26.0 mm. The upper surface 220 is generally flat and includes a horizontal portion. In some embodiments, the annular band 215 includes a first radius 310 at an interface between the outer surface 306 and the upper surface 220. In some embodiments, the annular band 215 includes a second radius 312 at an interface between the lower surface 226 and the inner surface 304.

The lower surface 226 of the annular band 215 includes a radially inner portion 322 and a radially outer portion 324 and a step 338 therebetween. The step 338 extends downward from the radially inner portion 322 to the radially outer portion 324. The radially inner portion 322 of the lower surface 226 sits on the lower ledge 135 of the substrate support 130 when disposed thereon, while the radially outer portion 324 surrounds the lower ledge 135. In some embodiments, the thickness of the annular band 215 at the radially inner portion 322 from the upper surface 220 to the lower surface 226 about 2.55 mm to about 3.0 mm. In some embodiments, the thickness of the annular band 215 at the radially outer portion 324 from the upper surface 220 to the lower surface 226 is about 4.76 mm to about 5.0 mm. A thicker outer portion of the annular band 215 corresponding with the radially outer portion 324 advantageously provides additional support to the thinner inner portion of the annular band 215 corresponding with the radially inner portion 322, leading to less cracking or breaking of the deposition ring 125.

In some embodiments, a diameter of the inner surface 304 of the inner lip 250 is about 285 mm to about 295 mm. In some embodiments, an outer diameter of the deposition ring is about 340 mm to about 380 mm. In some embodiments, a distance from the inner surface 304 of the annular band 215 to the step 338 (e.g. radially inner portion 322) is about 12.0 mm to about 15.0 mm. In some embodiments, a diameter of the step is about 315 mm to about 345 mm.

An inner lip 250 extends upwardly from the upper surface 220 and adjacent the inner surface 304 of the annular band 215. The inner lip 250 is substantially parallel to the peripheral wall 112 of the substrate support 130 so that an inner surface 308 of the inner lip 250 and the inner surface 304 of the annular band 215 are aligned and together form a central opening of the deposition ring 125 having a width less than the given width of the substrate 104. The central opening may define an inner diameter of the deposition ring 125. In some embodiments, the inner diameter of the deposition ring 125 is about 285 to about 295 mm.

The inner lip 250 terminates immediately below the overhanging edge 114 of the substrate 104. The inner lip 250 defines an inner perimeter of the deposition ring 125 which surrounds the substrate support 130 to protect regions of the substrate support 130 that are not covered by the substrate 104 during processing. For example, the inner lip 250 surrounds and at least partially covers the peripheral wall 112 of the substrate support 130 that would otherwise be exposed to the processing environment, to reduce or even entirely preclude deposition of sputtering deposits on the peripheral wall 112. Advantageously, the deposition ring 125 can be easily removed to clean sputtering deposits from the exposed surfaces of the deposition ring 125 so that the substrate support 130 can be cleaned without having to be dismantled. The deposition ring 125 can also serve to protect the exposed side surfaces of the substrate support 130 to reduce their erosion by the energized plasma species.

The inner lip 250 advantageously has a width small enough to reduce deposition of sputtering deposits on an outer surface 314 of the inner lip 250 yet large enough to reduce or prevent cracking or breaking of the deposition ring 125. The outer surface 314 of the inner lip 250 extends radially outward and downward from an upper surface 326 of the inner lip 250 to the upper surface 220 of the annular band 215 to strengthen the inner lip 250. The inventors have observed that an outer surface 314 that is tapered makes the deposition ring 125 less prone to cracking or breaking. In some embodiments, the outer surface 314 of the inner lip 250 extends at an angle 380 of about 5 degrees to about 15 degrees from a central axis 370 of the deposition ring 125.

In some embodiments, the inner lip 250 has a width of about 1.0 mm to about 4.0 mm. In some embodiments, the upper surface 326 of the inner lip 250 has a width of about 1.0 mm to about 2.5 mm. In some embodiments, when the deposition ring 125 is disposed on the pedestal 134, the upper surface 326 is about 0.1 mm to about 1.0 mm below the substrate support surface 138. In some embodiments, the outer surface 314 includes a radius 316 between a portion of the outer surface 314 that extends vertically and a portion of the upper surface 220 of the annular band 215 that extends horizontally. The radius may be advantageously small to reduce deposition of sputtering deposits on the outer surface 314. In some embodiments, the radius is about 2.0 mm to about 3.0 mm. In some embodiments, the radius is about 2.4 mm to about 2.6 mm.

The deposition ring 125 further includes a first leg 210 extending downwardly from adjacent the outer surface 306 of the annular band 215. A second leg 260 extends radially outward from a bottom portion 320 of the first leg 210. An outer lip 214 extends upwardly from the second leg 260. The first leg 210, the second leg 260, and the outer lip 214 together define a channel 240 of the deposition ring 125. In some embodiments, the channel 240 is disposed beneath the lower surface 226 of the annular band 215. In some embodiments, the first leg 210 has a length greater than a length of the inner lip 250.

In some embodiments, a depth 340 between the upper surface 220 of the annular band 215 and an upper surface 326 of the inner lip 250 is configured to accommodate at least about 6 or more mm of material deposition. For example, the depth 340 may be between about 6.0 mm to about 12.0 mm. In some embodiments, the depth 340 may be between about 6.0 mm and about 9.0 mm. As a result, sticking of the material deposition to the backside of the overhanging edge 114 of the substrate 104 is substantially reduced or eliminated altogether. In some embodiments, a distance between the upper surface 326 of the inner lip 250 and a substrate receiving surface of the pedestal 134 is about 1.0 mm to about 2.0 mm. To accommodate the deposition ring 125 having a larger depth 340, the lower ledge 135 is disposed further away from the substrate support surface 138. An upper surface of the deposition ring 125 includes the upper surface 326 of the inner lip 250, the outer surface 314 of the inner lip 250 and the horizontal portion of the upper surface 220. A lower surface of the deposition ring 125 includes the lower surface 226 of the annular band 215, a radially inner surface of the first leg 210, a lower surface of the second leg 260, and a radially outer surface of the outer lip 214.

The cover ring section 122 at least partially covers the deposition ring 125. The deposition ring 125 and cover ring section 122 cooperate with one another to reduce formation of sputter deposits on the peripheral walls of the substrate support 130 and an overhanging edge 114 of the substrate 104. In some embodiments, the cover ring section 122 includes a protrusion 230 configured to interface with the channel 240 in the deposition ring 125. Sidewalls of the channel 240 are defined by a radially inner surface of the outer lip 214 and a radially outward surface of the first leg 210. A bottom wall of the channel 240 is defined by an upper surface of the second leg 260. The channel 212 is disposed radially outward of the inner lip 250. The outer lip 214 is disposed radially outward of the channel 212. The outer lip 214 is configured to interface with a corresponding recess 216 in the cover ring section 122. In some embodiments, a width of the outer lip 214 from the radially inner surface to a radially outer surface is about 2.0 mm to about 3.0 mm. In some embodiments, an upper surface 342 of the outer lip 214 is disposed below the lower surface 226 of the annular band 215. In some embodiments, the outer lip 214 has a length greater than a length of the inner lip 250.

Figure 4:
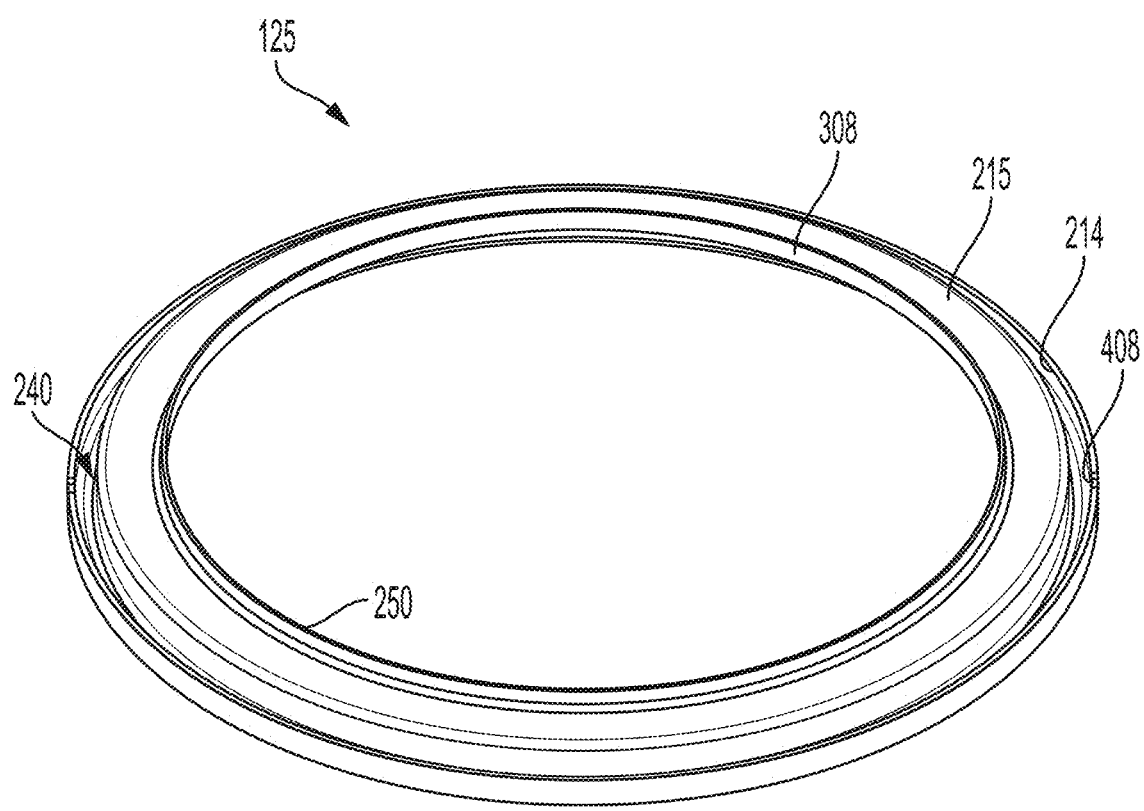
FIG. 4 depicts a top isometric view of a deposition ring in accordance with some embodiments of the present disclosure.

FIG. 4 depicts a top isometric view of a deposition ring in accordance with some embodiments of the present disclosure. The deposition ring 125 is advantageously sized to surround the substrate support 130 with a minimal gap therebetween, for example, about 0.1 mm to about 0.5 mm. In some embodiments, an inner diameter of the deposition ring 125 is about 285.0 mm to about 295.0 mm. In some embodiments the inner diameter of the deposition ring 125 is about 285.0 mm to about 295.0 mm. In some embodiments, an outer diameter of the deposition ring 125 is about 340.0 mm to about 370.0 mm. In some embodiments, the deposition ring 125 does not include protrusions extending radially inwards from the inner surface 308 of the inner lip 250. In some embodiments, the outer lip 214 includes slots 408. As shown in FIG. 4, the outer lip 214 includes two slots 408 disposed opposite each other about the deposition ring 125. The slots 408 are configured to each receive a clamp assembly 500 as described below with respect to FIG. 5.

Figure 5:
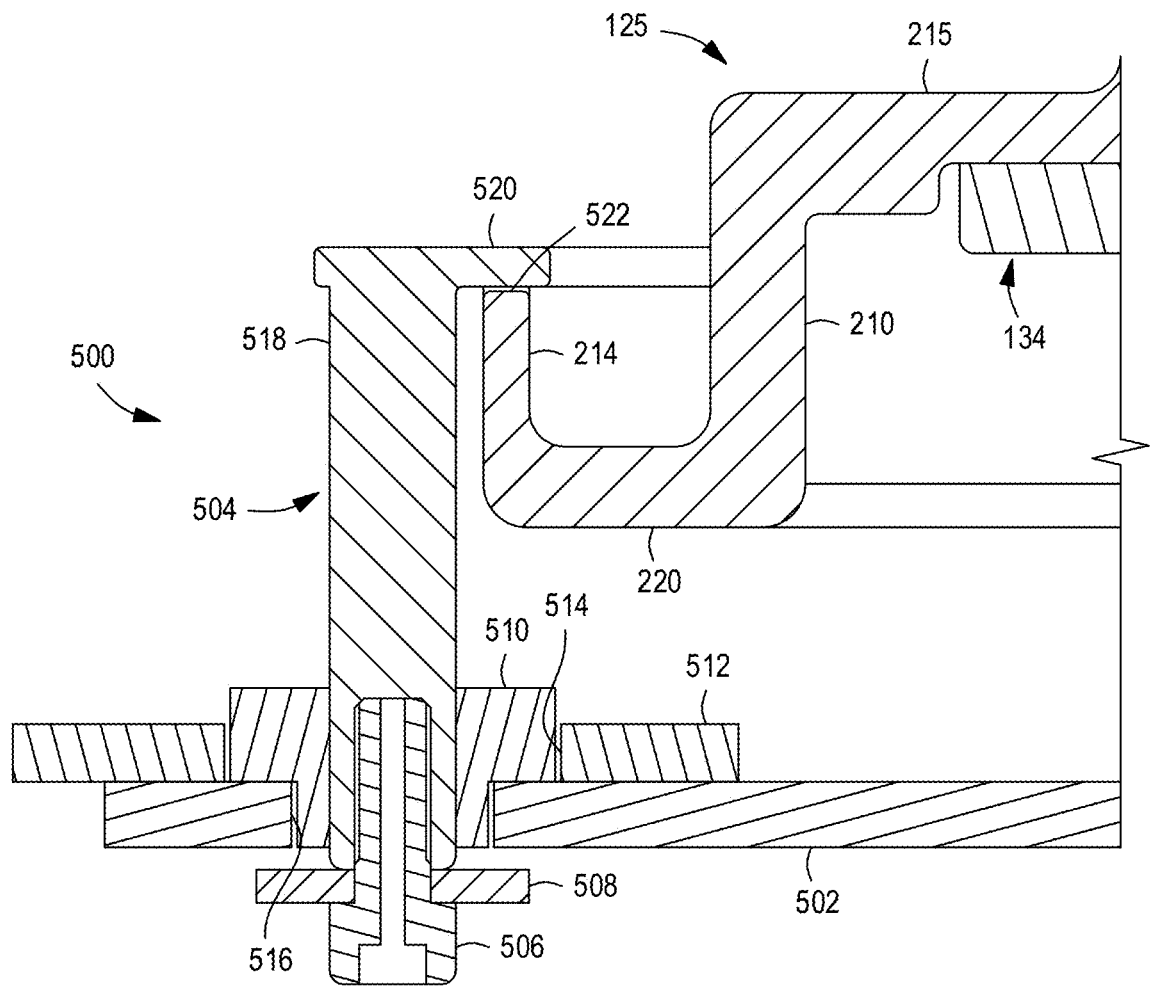
FIG. 5 depicts a schematic cross-sectional view of a deposition ring and clamp assembly in accordance with some embodiments of the present disclosure.

In some embodiments, the process kit 102 may further include a clamp assembly 500 to further advantageously prevent the material deposition and the deposition ring 125 from sticking to the backside of the overhanging edge 114 of the substrate 104. FIG. 5 depicts a schematic cross-sectional view of the deposition ring 125 and a clamp assembly 500 in accordance with some embodiments of the present disclosure. Each of the slots 408 have a corresponding clamp assembly 500. The clamp assembly 500 includes a base plate 502 and a clamp 504 to clamp down the deposition ring 125. The base plate 502 is coupled to the substrate support 130 (e.g., to a bottom surface of the pedestal 134). The clamp 504 is disposed in an opening 516 of the base plate 502. The clamp 504 includes a shaft 518 and a tab 520 that extends radially outwards from a top portion of the shaft 518. The tab 520 is configured to rest on a lower surface 522 of the slot 408 of the deposition ring 125 to prevent the deposition ring 125 from being raised. The clamp 504 may be coupled to the base plate 502. For example, the clamp 504 may be coupled to the base plate 502 via screws or bolts. In some embodiments, the clamp 504 is rotatably coupled to the base plate 502. In some embodiments, the clamp 504 may be raised or lowered with respect to the base plate 502 to place the tab 520 into or out of slot 408.

In some embodiments, the clamp assembly 500 includes a bracket 512 and a bushing 510 resting an upper surface of the base plate 502. The bushing 510 is disposed in a central opening 514 of the bracket 512 and in an opening 516 of the base plate 502. The bracket 512 includes a raised portion that includes a step that extends radially inwards from the central opening 514 and overhangs the bushing 510. The step is configured to prevent the bushing 510 from lifting with respect to the base plate 502. A washer 508 having an outer diameter greater than a diameter of the opening 516 is disposed below the base plate 502. A fastener 506 is disposed below the washer 508 to secure the washer 508 to the clamp 504 to couple the clamp 504 to the base plate 502. The washer 508 and the tab 520 are configured to couple the clamp 504 to the base plate 502 while allowing the clamp 504 to rotate within the opening 516 and to be raised or lowered (e.g. vertical movement) with respect to the base plate 502. The clamp 504 may be raised, rotated, and lowered to allow removal of the deposition ring 125.

Although the deposition ring 125 is configured to accommodate more material deposition compared to conventional deposition rings, if the deposition ring 125 is not cleaned after the intended thickness of material deposition has accumulated on the deposition ring 125, the material deposition will stick to the backside of the overhanging edge 114 of the substrate 104. As a result, when the substrate 104 is lifted off of the substrate support 130, the deposition ring 125 will be lifted with the substrate 104. To combat the lifting of the deposition ring 125 due to improper use, the clamp assembly 500 is configured to interface with the deposition ring 125 to prevent vertical movement of the deposition ring, thus advantageously avoiding damage to the substrate 104 or the deposition ring 125 caused by lifting of the deposition ring 125 with the substrate 104.

Returning back to FIG. 1, the one-piece shield 110 encircles the sputtering surface 139 of the sputtering target 140 that faces the substrate support 130 and the outer periphery of the substrate support 130. The one-piece shield 110 covers and shadows the sidewalls 116 of the process chamber 100 to reduce deposition of sputtering deposits originating from the sputtering surface 139 of the sputtering target 140 onto the components and surfaces behind the one-piece shield 110. For example, the one-piece shield 110 can protect the surfaces of the substrate support 130, overhanging edge 114 of the substrate 104, sidewalls 116 and bottom wall 120 of the process chamber 100.

The adapter section 136 supports the one-piece shield 110 and can serve as a heat exchanger about a sidewall 116 of the process chamber 100. In some embodiments, a heat transfer channel 152 is disposed in the upper portion 128 to flow a heat transfer medium. In some embodiments, the heat transfer channel 152 is disposed in the adapter section 136. Because the one-piece shield 110 is of unitary construction, the heat transfer medium flowing through the heat transfer channel 152 directly cools/heats the areas of the one-piece shield 110 corresponding to the shield and cover ring (i.e., the cylindrical body 126 and cover ring section 122, respectively). Furthermore, the unitary construction of the one-piece shield 110 advantageously allows for a direct coupling of a heat transfer medium supply 180 to the shield, which was previously indirectly coupled to a heat transfer supply via the adapter. The heat transfer medium supply 180 can flow a heat transfer medium through the heat transfer channel 152 at a flowrate sufficient to maintain a desired shield temperature.

The one-piece shield 110 allows for improved heat transfer from the one-piece shield 110 to and which reduces thermal expansion stresses on the material deposited on the shield. Portions of the one-piece shield 110 can become excessively heated by exposure to the plasma formed in the substrate processing chamber, resulting in thermal expansion of the shield and causing sputtering deposits formed on the shield to flake off from the shield and fall upon and contaminate the substrate 104. The unitary construction of the adapter section 136 and the cylindrical body 126 results in improved thermal conductivity between the adapter section 136 and the cylindrical body 126.

In some embodiments, the one-piece shield 110 comprises a unitary structure which is made from a monolith of material. For example, the one-piece shield 110 may be formed of stainless steel or aluminum. The unitary construction of the one-piece shield 110 is advantageous over shield designs that often include two or three separate pieces to make up the complete shield. For example, a single piece shield is more thermally uniform than a multiple-component shield, in both heating and cooling processes. For example, the one-piece shield 110 eliminates thermal interfaces between the cylindrical body 126, the adapter section 136, and the cover ring section 122 allowing for more control over the heat exchange between these sections. In some embodiments, the heat transfer medium supply 180 flows a coolant through the heat transfer channel 152 to combat the adverse effects of an overheated shield on the sputtered material deposited on the substrate 104, as explained above. In some embodiments, the heat transfer medium supply 180 flows a heated fluid through the heat transfer channel 152 to mitigate the difference between the coefficients of the thermal expansion of the sputtered material and the shield.

Furthermore, a shield with multiple components is more difficult and laborious to remove for cleaning. The one-piece shield 110 has a continuous surface exposed to the sputtering deposits without interfaces or corners that are more difficult to clean out. The one-piece shield 110 also more effectively shields the chamber walls 106 from sputter deposition during process cycles. In some embodiments, surfaces of the one-piece shield 110 exposed to the inner volume 108 in the process chamber 100 may be bead blasted to reduce particle shedding and prevent contamination within the process chamber 100.

The cover ring section 122 encircles and at least partially covers the deposition ring 125 to receive, and thus, shadow the deposition ring 125 from the bulk of the sputtering deposits. The cover ring section 122 comprises a projecting brim 270 which overlays a portion of the deposition ring 125. The projecting brim 270 includes an inclined surface 264 that is sloped radially inwards and downwards and encircles the substrate support 130. The projecting brim 270 reduces deposition of sputtering deposits on the deposition ring 125. The cover ring section 122 is sized, shaped, and positioned to cooperate with and complement the deposition ring 125 to form a tortuous flow path between the cover ring section 122 and deposition ring 125, thus inhibiting the flow of process deposits onto the peripheral wall 112.

The tortuous flow path restricts the build-up of low-energy sputter deposits on the mating surfaces of the deposition ring 125 and cover ring section 122, which would otherwise cause the deposition ring 125 and cover ring section 122 to stick to one another or to the overhanging edge 114 of the substrate 104. The annular band 215 of the deposition ring 125 which extends underneath the overhanging edge 114 is designed in conjunction with shadowing from the projecting brim 270 of the cover ring section 122 to collect sputter deposits in a sputtering chamber, while reducing or even substantially precluding sputter deposition on the mating surfaces of the cover ring section 122 and the deposition ring 125.

As shown in FIGS. 1 and 2, the sputtering target 140 comprises a sputtering plate 144 mounted to a backing plate 150. The sputtering plate 144 comprises a material to be sputtered onto the substrate 104. The sputtering plate 144 may have a sputtering surface 139 that forms a plane that is parallel to the plane of the substrate 104. A peripheral inclined sidewall 288 surrounds the sputtering surface 139. The peripheral inclined sidewall 288 may be inclined relative to the plane of the sputtering surface 139. The peripheral inclined sidewall 288 may be inclined relative to the plane of the cylindrical mesa 286 by an angle of at least about 60°, for example, from about 75° to about 85°.

The peripheral inclined sidewall 288 that is adjacent to the upper portion 128 of the one-piece shield 110 forms a gap 200 comprising a dark space region. The dark space region is an area which is highly depleted of free electrons and which can be modeled as a vacuum. Control of the dark space region advantageously prevents plasma entry into the dark space region, arcing, and plasma instability. A shape of the gap 200 impedes the passage of sputtered plasma species through the gap 200, and thus, reduces the accumulation of sputtered deposits on the surfaces of the peripheral target region.

The sputtering plate 144 comprises a metal or metal compound. For example, the sputtering plate 144 can be a metal, such as, for example aluminum, copper, tungsten, titanium, cobalt, nickel or tantalum. The sputtering plate 144 can also be a metal compound, such as for example, tantalum nitride, tungsten nitride or titanium nitride.

The backing plate 150 which has a support surface 201 to support the sputtering plate 144 and a peripheral ledge 202 that extends beyond the radius of the sputtering plate 144. The backing plate 150 is made from a metal, such as, for example, stainless steel, aluminum, copper-chromium or copper-zinc. The backing plate 150 can be made from a material having a thermal conductivity that is sufficiently high to dissipate the heat generated in the sputtering target 140, which is formed in both the sputtering plate 144 and the backing plate 150. The heat is generated from the eddy currents that arise in the sputtering plate 144 and the backing plate 150 and also from the bombardment of energetic ions from the plasma onto the sputtering surface 139 of the sputtering target 140. The higher thermal conductivity of the backing plate 150 allows dissipation of the heat generated in the sputtering target 140 to the surrounding structures or even to a heat exchanger that may be mounted behind the backing plate 150 or may be in the backing plate 150, itself. For example, the backing plate 150 can comprise channels (not shown) to circulate a heat transfer fluid therein. A suitably high thermal conductivity of the backing plate 150 is at least about 200 W/m-K, for example, from about 220 to about 400 W/m-K. Such a thermal conductivity level allows the sputtering target 140 to be operated for longer process time periods by dissipating the heat generated in the sputtering target 140 more efficiently.

In combination with a backing plate 150 made of a material having a high thermal conductivity and low resistivity, or separately and by itself, the backing plate 150 may comprises a backside surface having one or more grooves 252. For example, a backing plate 150 could have a groove 252, such as annular groove, or a ridge, for cooling the backside 141 of the sputtering target 140. The grooves 252 and ridges can also have other patterns, for example, rectangular grid pattern, chicken feet patterns, or simply straight lines running across the backside surface.

In some embodiments, the sputtering plate 144 may be mounted on the backing plate 150 by diffusion bonding, for example, by placing the sputtering plate 144 on the backing plate 150 and heating the sputtering plate 144 and the backing plate 150 to a suitable temperature, typically at least about 200° C. Optionally, the sputtering target 140 may be a monolithic structure comprising a single piece of material having enough depth to serve as both the sputtering plate and backing plate.

The peripheral ledge 202 of the backing plate 150 comprises an outer footing 204 that rests on an isolator 154 in the process chamber 100. The peripheral ledge 202 contains an O-ring groove 206 into which an O-ring 208 is placed to form a vacuum seal. The isolator 154 electrically isolates and separates the backing plate 150 from the process chamber 100 and is typically a ring formed of a dielectric or insulative material such as aluminum oxide. The peripheral ledge 202 is shaped to inhibit the flow or migration of sputtered material and plasma species through a gap between the sputtering target 140 and the isolator 154, to impede the penetration of low-angle sputtered deposits into the gap.

Returning to FIG. 1, the sputtering target 140 is connected to one or both of a DC power source 146 and an RF power source 148. The DC power source 146 can apply a bias voltage to the sputtering target 140 relative to the one-piece shield 110, which may be electrically floating during a sputtering process. While the DC power source 146 supplies power to the sputtering target 140, the one-piece shield 110, the substrate support 130, and other chamber components connected to the DC power source 146. At least one of the DC power source 146 and the RF power source 148 energizes the sputtering gas to form a plasma of the sputtering gas. The plasma formed impinges upon and bombards the sputtering surface 139 of the sputtering target 140 to sputter material off the sputtering surface 139 onto the substrate 104.

In some embodiments, the process chamber 100 may include a magnetic field generator 156 to shape a magnetic field about the sputtering target 140 to improve sputtering of the sputtering target 140. The capacitively generated plasma may be enhanced by a magnetic field generator 156 in which for example, a permanent magnet or electromagnetic coils may provide a magnetic field in the process chamber 100 that has a rotating magnetic field having an rotational axis that is perpendicular to the plane of the substrate 104. The process chamber 100 may, in addition or alternatively, comprise a magnetic field generator 156 that generates a magnetic field near the sputtering target 140 of the process chamber 100 to increase an ion density in a high-density plasma region adjacent to the sputtering target 140 to improve the sputtering of the target material.

The sputtering gas is introduced into the process chamber 100 through a gas delivery system 158, which provides gas from a gas supply 160 via conduits 162 having gas flow control valves 164, such as a mass flow controllers, to pass a set flow rate of the gas. The gases are fed to a mixing manifold (not shown) in which the gases are mixed to from a desired process gas composition and fed to a gas distributor 166 having gas outlets to introduce the gas into the process chamber 100. The process gas may comprise a non-reactive gas, such as argon or xenon, which is capable of energetically impinging upon and sputtering material from the sputtering target 140. The process gas may also comprise a reactive gas, such as one or more of an oxygen-containing gas and a nitrogen-containing gas, that are capable of reacting with the sputtered material to form a layer on the substrate 104. The gas is then energized by at least one of the DC power source 146 and the RF power source 148 to form a plasma to sputter the sputtering target 140. Spent process gas and byproducts are exhausted from the process chamber 100 through an exhaust 168. The exhaust 168 comprises an exhaust port 170 that receives spent process gas and passes the spent gas to an exhaust conduit 172 having a throttle valve to control the pressure of the gas in the process chamber 100. The exhaust conduit 172 is connected to one or more exhaust pumps 174.

Various components of the process chamber 100 may be controlled by a controller 176. The controller 176 comprises program code having instruction sets to operate the components to process a substrate 104. For example, the controller 176 can comprise program code that includes substrate positioning instruction sets to operate the substrate support 130 and substrate transfer mechanism; gas flow control instruction sets to operate gas flow control valves to set a flow of sputtering gas to the process chamber 100; gas pressure control instruction sets to operate the exhaust throttle valve to maintain a pressure in the process chamber 100; gas energizer control instruction sets to operate at least one of the DC power source 146 and the RF power source 148 to set a gas energizing power level; temperature control instruction sets to control a temperature control system in the substrate support 130 or the heat transfer medium supply 180 to control a flowrate of the heat transfer medium to the heat transfer channel 152; and process monitoring instruction sets to monitor the process in the process chamber 100.

Figure 6:
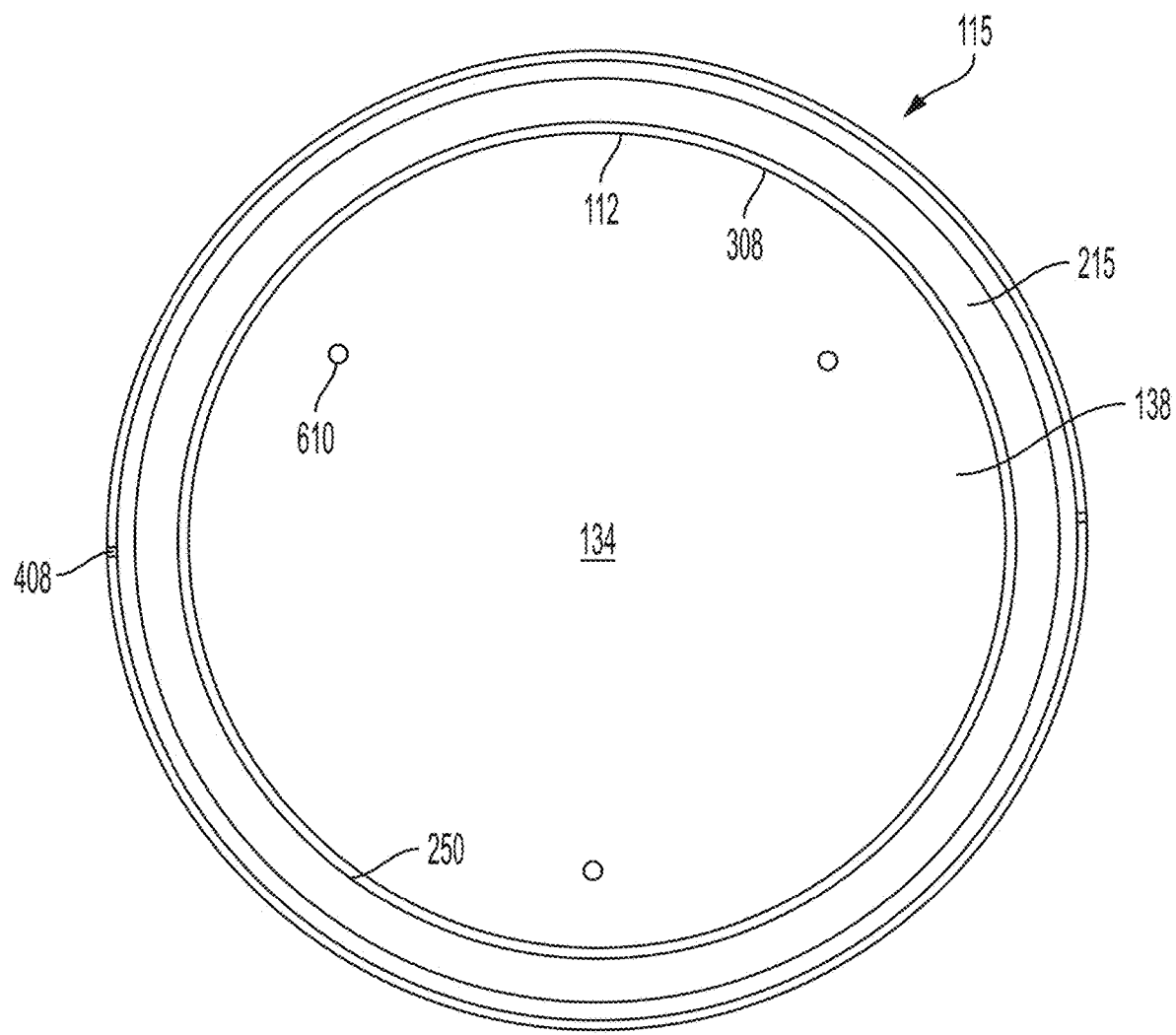
FIG. 6 depicts a top view of a pedestal and a deposition ring in accordance with some embodiments of the present disclosure.

FIG. 6 depicts a top view of a pedestal 134 and a deposition ring 125 in accordance with some embodiments of the present disclosure. In some embodiments, the inner surface 308 of the inner lip 250 forms a continuous circle with no protrusions or alignment tabs extending radially inward such that the deposition ring 125 is rotatable with respect to the pedestal 134 when disposed on the pedestal 134. In some embodiments, the substrate support surface 138 includes an epoxy coating. In some embodiments, the epoxy coating is about 2 to about 4 micrometers thick. In some embodiments, the pedestal 134 includes one or more lift pin openings 610 configured to facilitate a lift pin passing therethrough to raise of lower the substrate 104 off of or onto the pedestal 134.

While the foregoing is directed to embodiments of the present disclosure, other and further embodiments of the disclosure may be devised without departing from the basic scope thereof.

The invention claimed is:

1. A process kit, comprising:
   a deposition ring configured to be disposed on a substrate support, the deposition ring comprising:
   an annular band configured to rest on a lower ledge of the substrate support, the annular band having an upper surface and a lower surface, the lower surface including a step between a radially inner portion and a radially outer portion, the step extending downward from the radially inner portion to the radially outer portion;
   an inner lip extending upwards from the upper surface of the annular band and adjacent an inner surface of the annular band, wherein an inner surface of the inner lip and the inner surface of the annular band together form a central opening of the deposition ring, and wherein an outer surface of the inner lip extends radially outward and downward from an upper surface of the inner lip to the upper surface of the annular band;
   a channel disposed radially outward of the annular band; and
   an outer lip extending upwardly and disposed radially outward of the channel, wherein an upper surface of the outer lip and the channel are disposed beneath the lower surface of the annular band.

2. The process kit of claim 1, wherein a width of the inner lip is about 2.0 mm to about 4.5 mm.

3. The process kit of claim 1, wherein a thickness of the annular band at the radially inner portion of is about 2.55 mm to about 3.0 mm.

4. The process kit of claim 1, wherein a thickness of the annular band at the radially outer portion is about 4.76 mm to about 5.0 mm.

5. The process kit of claim 1, wherein the outer surface of the inner lip extends at an angle of about 5 degrees to about 15 degrees from a central axis of the deposition ring.

6. The process kit of claim 1, wherein a diameter of the inner surface of the inner lip is about 285 mm to about 295 mm.

7. The process kit of claim 1, wherein an outer diameter of the deposition ring is about 340 mm to about 380 mm.

8. The process kit of claim 1, wherein the inner surface of the inner lip forms a continuous circle with no protrusions extending radially inward.

9. The process kit of claim 1, wherein the outer lip includes one or more slots configured to receive a clamp assembly.

10. The process kit of claim 1, further comprising:
   a one-piece process kit shield having a cylindrical body having an upper portion and a lower portion and a cover ring section extending radially inward from the lower portion,
   wherein the cover ring section includes a protrusion extending into the channel of the deposition ring and a recess into which the outer lip extends to define a tortuous flow path between the cover ring section and the deposition ring.

11. A process kit, comprising:
a deposition ring configured to be disposed on a substrate support, the deposition ring comprising:
an annular band configured to rest on a lower ledge of the substrate support, the annular band having an upper surface and a lower surface, the lower surface including a step between a radially inner portion and a radially outer portion, the step extending downward from the radially inner portion to the radially outer portion;
an inner lip extending upwards from the upper surface of the annular band and adjacent an inner surface of the annular band, wherein an inner surface of the inner lip and the inner surface of the annular band together form a central opening of the deposition ring, wherein an outer surface of the inner lip extends at an angle of about 5 degrees to about 15 degrees from a central axis of the deposition ring;
a first leg extending downwardly from adjacent an outer surface of the annular band;
a second leg extending radially outward from a bottom portion of the first leg; and
an outer lip extending upwardly from the second leg, wherein the first leg, the second leg, and the outer lip together define a channel.

12. The process kit of claim 11, wherein the first leg has a length greater than a length of the inner lip.

13. The process kit of claim 11, wherein the outer lip has a length greater than a length of the inner lip.

14. The process kit of claim 11, wherein a diameter of the step is about 315 mm to about 345 mm.

15. A substrate support, comprising:
a pedestal having a substrate support surface having a given diameter for receiving a substrate and having an electrostatic chuck disposed therein, wherein the pedestal includes a lower ledge extending radially outward; and
a process kit comprising:
a deposition ring disposed on the lower ledge, the deposition ring comprising:
an annular band that rests on the lower ledge, the annular band having an upper surface and a lower surface, the lower surface including a step between a radially inner portion and a radially outer portion, the step extending downward from the radially inner portion to the radially outer portion;
an inner lip extending upwards from the upper surface of the annular band and adjacent an inner surface of the annular band, wherein an outer surface of the inner lip extends radially outward and downward from an upper surface of the inner lip to the upper surface of the annular band;
a channel disposed radially outward of and beneath the annular band; and
an outer lip extending upwardly and disposed radially outward of the channel.

16. The substrate support of claim 15, wherein a distance between the substrate support surface and an upper surface of the lower ledge is about 8 to about 11 mm.

17. The substrate support of claim 15, wherein the given diameter is about 285 mm to about 293 mm.

18. The substrate support of claim 15, wherein lower ledge has a thickness of about 10 mm to about 15 mm.

19. The substrate support of claim 15, wherein the deposition ring is rotatable with respect to the pedestal when disposed on the pedestal.

20. The substrate support of claim 15, wherein the substrate receiving surface includes an epoxy coating.

* * * * *